United States Patent
Hwang et al.

(10) Patent No.: US 11,219,125 B2
(45) Date of Patent: Jan. 4, 2022

(54) TRANSPARENT CONDUCTOR AND DISPLAY DEVICE INCLUDING SAME

(71) Applicant: SAMSUNG SDI CO., LTD., Yongin-si (KR)

(72) Inventors: Oh Hyeon Hwang, Suwon-si (KR); Dong Myeong Shin, Suwon-si (KR); Ji Young Han, Suwon-si (KR); Do Young Kim, Suwon-si (KR); Young Hoon Kim, Suwon-si (KR); Tae Ji Kim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 32 days.

(21) Appl. No.: 16/320,453

(22) PCT Filed: Dec. 14, 2016

(86) PCT No.: PCT/KR2016/014643
§ 371 (c)(1),
(2) Date: Jan. 24, 2019

(87) PCT Pub. No.: WO2018/021632
PCT Pub. Date: Feb. 1, 2018

(65) Prior Publication Data
US 2019/0258334 A1  Aug. 22, 2019

(30) Foreign Application Priority Data
Jul. 28, 2016 (KR) .................. 10-2016-0096477

(51) Int. Cl.
*G06F 3/041* (2006.01)
*H05K 1/11* (2006.01)
(Continued)

(52) U.S. Cl.
CPC ................. *H05K 1/11* (2013.01); *H01B 5/14* (2013.01); *H05K 1/0295* (2013.01); *H05K 1/09* (2013.01);
(Continued)

(58) Field of Classification Search
CPC ........... G06F 3/041; B23B 7/023; H05K 1/09; H05K 3/06; H05K 1/11; H05K 2201/09218; H05K 2201/09227; H05K 2201/09281
See application file for complete search history.

(56) References Cited

U.S. PATENT DOCUMENTS 4,916,514 A * 4/1990 Nowak ............... H01L 23/5283
257/752
5,032,890 A * 7/1991 Ushiku ............... H01L 23/5222
257/211
(Continued)

FOREIGN PATENT DOCUMENTS

CN  102723126 A  10/2012
CN  103842944 A  6/2014
(Continued)

OTHER PUBLICATIONS

Korean Office action in corresponding Korean application 10-2016-0096477, Korean Office action dated Jan. 28, 2019 (5 pgs.).
(Continued)

*Primary Examiner* — Paresh H Paghadal
(74) *Attorney, Agent, or Firm* — Lewis Roca Rothgerber Christie LLP

(57) ABSTRACT

Provided are a transparent conductor and a display device including the same, the transparent conductor including: a substrate layer; and a transparent conductive pattern layer formed on the substrate layer, and the transparent conductive pattern layer includes a plurality of conductive areas and
(Continued)

non-conductive areas, the non-conductive areas are formed every between neighboring conductive areas, the non-conductive area in the transparent conductive pattern layer has a deviation as calculated by Equation 1 herein, which has a value larger than about 1 and equal to or smaller than about 1.25, and the non-conductive areas have a minimum line width of 40 μm or less.

7 Claims, 1 Drawing Sheet

(51) Int. Cl.
   *H01B 5/14* (2006.01)
   *H05K 1/09* (2006.01)
   *H05K 1/02* (2006.01)

(52) U.S. Cl.
   CPC ...... *G06F 3/041* (2013.01); *H05K 2201/0979* (2013.01); *H05K 2201/09218* (2013.01); *H05K 2201/09227* (2013.01); *H05K 2201/09254* (2013.01); *H05K 2201/09281* (2013.01); *H05K 2201/09409* (2013.01)

(56) References Cited

U.S. PATENT DOCUMENTS

| | | | | | |
|---|---|---|---|---|---|
| 5,357,140 | A * | 10/1994 | Kozasa | ............... | H01L 23/5283 257/752 |
| 5,888,900 | A * | 3/1999 | Mizuno | ............. | H01L 21/31053 257/E21.244 |
| 6,297,811 | B1 * | 10/2001 | Kent | ........................ | G06F 3/044 178/18.01 |
| 6,888,250 | B2 * | 5/2005 | Mori | ..................... | G06F 30/394 257/773 |
| 7,392,496 | B1 * | 6/2008 | Schultz | .................. | G06F 30/39 716/113 |
| 9,007,333 | B1 * | 4/2015 | Wilson et al. | ........ | G06F 3/0418 345/174 |
| 9,086,770 | B2 * | 7/2015 | Yilmaz | ................. | G06F 3/0443 |
| 9,152,278 | B2 * | 10/2015 | Kent | ........................ | G06F 3/044 |
| 9,194,901 | B2 * | 11/2015 | Herman | ............. | G01R 27/2605 |
| 9,360,971 | B2 * | 6/2016 | Barton | .................... | G06F 3/044 |
| 9,927,916 | B2 * | 3/2018 | Jeong et al. | .......... | G06F 3/0416 |
| 2005/0287797 | A1 * | 12/2005 | Morita | ..................... | G03F 1/36 438/638 |
| 2008/0024415 | A1 * | 1/2008 | Jung | .................. | G02F 1/13454 345/92 |
| 2010/0065113 | A1 * | 3/2010 | Diau | .................... | H01G 9/2031 136/256 |
| 2010/0065114 | A1 * | 3/2010 | Diau | .................... | H01G 9/2031 136/256 |
| 2011/0095990 | A1 * | 4/2011 | Philipp | ................... | G06F 3/044 345/173 |
| 2014/0002369 | A1 * | 1/2014 | Guard | ............... | H03K 17/9622 345/173 |
| 2014/0027169 | A1 * | 1/2014 | Huang | ..................... | H05K 1/09 174/268 |
| 2014/0055412 | A1 * | 2/2014 | Teramoto | ............. | G06F 3/0446 345/174 |
| 2014/0306922 | A1 * | 10/2014 | Yilmaz | ................... | G06F 3/044 345/174 |
| 2014/0332256 | A1 * | 11/2014 | Cok | ........................ | G06F 3/044 174/253 |
| 2015/0085201 | A1 * | 3/2015 | Chen | .................... | G06F 3/0448 349/12 |
| 2015/0118508 | A1 * | 4/2015 | Shin | ........................ | H01B 1/22 428/457 |
| 2016/0085339 | A1 * | 3/2016 | Yashiro et al. | ........ | G06F 3/0412 345/174 |
| 2016/0085351 | A1 * | 3/2016 | Adachi | ................... | G06F 3/041 345/174 |
| 2016/0147344 | A1 * | 5/2016 | Yuan | ..................... | G06F 3/0445 345/173 |
| 2016/0283031 | A1 * | 9/2016 | Hwang | ................. | G06F 3/0412 |
| 2016/0334933 | A1 * | 11/2016 | Ono | ....................... | G06F 3/0445 |
| 2017/0160830 | A1 * | 6/2017 | Lee | ........................ | G06F 3/0443 |
| 2018/0351476 | A1 * | 12/2018 | Cha | ........................ | H02N 1/002 |

FOREIGN PATENT DOCUMENTS

| | | | |
|---|---|---|---|
| JP | 2011-96225 A | 5/2011 | |
| JP | 2013-077235 A | 4/2013 | |
| JP | 2013-191069 A | 9/2013 | |
| JP | 2014-175187 A | 9/2014 | |
| KR | 10-2012-0053724 A | 5/2012 | |
| KR | 10-2014-0126369 A | 10/2014 | |
| KR | 10-2015-0048042 A | 5/2015 | |
| KR | 20170116911 A | * 10/2017 | ........... G02F 1/1335 |

OTHER PUBLICATIONS

China Office action from corresponding Chinese Patent Application No. 201680087951.4, Chinese Office action dated Aug. 30, 2019 (6 pgs.).

* cited by examiner

【FIG. 1】
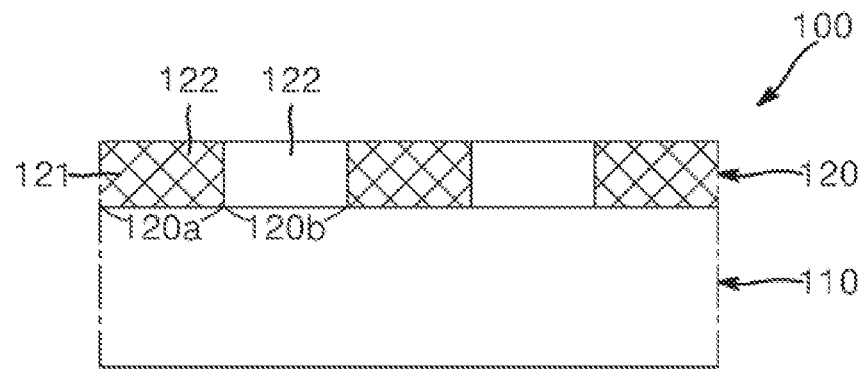
【FIG. 2】
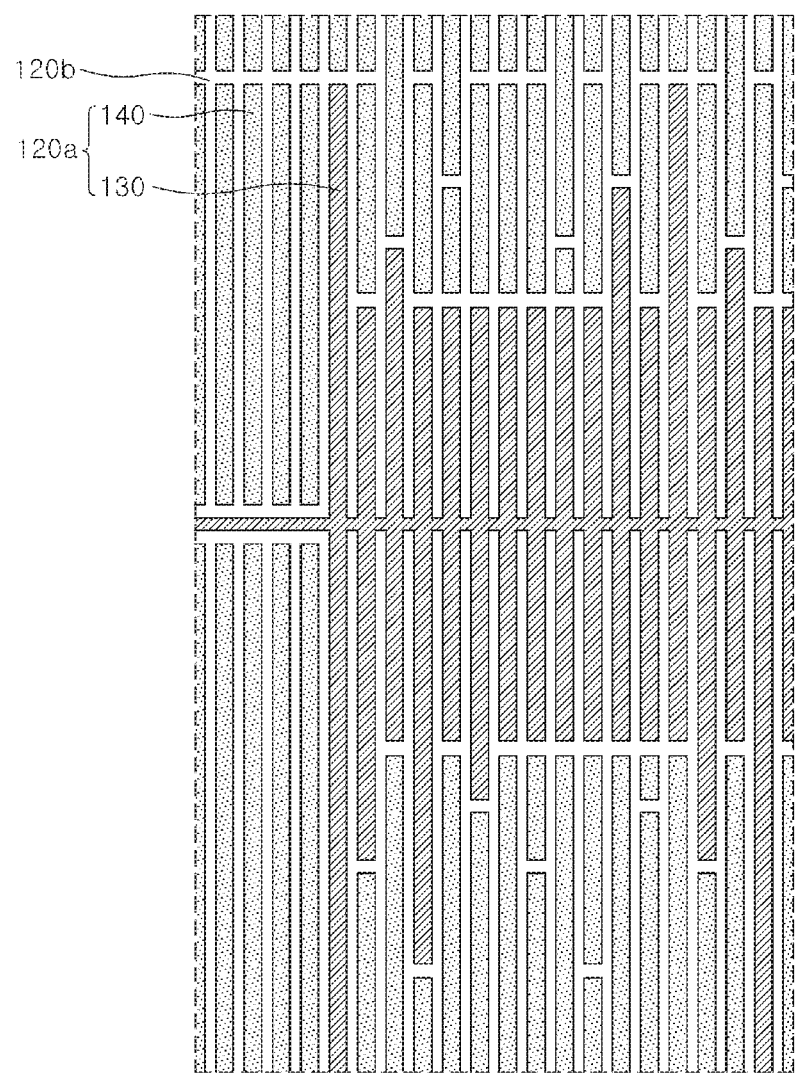

TRANSPARENT CONDUCTOR AND DISPLAY DEVICE INCLUDING SAME

CROSS-REFERENCE TO RELATED APPLICATIONS

This application is a National Phase Patent Application and claims priority to and the benefit of International Application Number PCT/KR2016/014643, filed on Dec. 14, 2016, which claims priority to and the benefit of Korean Patent Application No. 10-2016-0096477, filed on Jul. 28, 2016, the entire contents of each of which are incorporated herein by reference.

FIELD

The present invention relates to a transparent conductor and a display device including the same.

BACKGROUND

A display including a touchscreen panel includes a transparent conductor. A transparent conductor including an indium tin oxide (ITO) film may include an index matching layer disposed at a lower side thereof in order to improve pattern visibility.

A metal nanowire-containing film may be used as a transparent conductor. Metal nanowires have good flexibility to secure flexibility of the transparent conductor. However, such a transparent conductor can suffer from deterioration in pattern visibility due to light scattering, haze and the like, which are inherent optical properties of the metal nanowires. In particular, when sheet resistance of the transparent conductor is reduced to secure good electrical characteristics, the optical properties of the transparent conductor are also further reduced, thereby causing deterioration in pattern visibility. Therefore, there is a need for a technique for improving pattern visibility of the transparent conductor containing metal nanowires.

The background technique of the present invention is disclosed in Korean Patent Laid-open Publication No. 2012-0053724 and the like.

SUMMARY

It is one aspect of the present invention to provide a transparent conductor containing metal nanowires and having good pattern visibility.

It is another aspect of the present invention to provide a transparent conductor having low sheet resistance and good optical properties in terms of haze, transmittance, and the like.

One aspect of the present invention relates to a transparent conductor. The transparent conductor includes: a base layer; and a transparent conductive pattern layer formed on the base layer, wherein the transparent conductive pattern layer includes a plurality of conductive regions and non-conductive regions disposed between adjacent conductive regions, and the non-conductive regions having a deviation of greater than about 1 to about 1.25, as calculated by Equation 1, and a minimum linewidth of about 40 μm or less.

Deviation of non-conductive regions=$A/B$,     <Equation 1> where A and B indicate the maximum value and the minimum value of areas of the non-conductive regions included in a unit area of 1 mm² of the transparent conductive pattern layer, respectively.

In one embodiment, the non-conductive regions may have a minimum linewidth of about 10 μm to about 40 μm.

In one embodiment, some of the conductive regions may form a dummy pattern.

In one embodiment, the plurality of conductive regions may form a driving pattern and a dummy pattern, and the non-conductive regions may be continuously formed.

In one embodiment, the non-conductive regions may be formed between the driving pattern and the dummy pattern.

In one embodiment, the non-conductive regions may be formed between adjacent dummy patterns.

In one embodiment, the transparent conductive pattern layer may include a plurality of units each including the non-conductive regions formed between adjacent dummy patterns.

In one embodiment, the conductive regions may include metal nanowires and a matrix in which the metal nanowires are impregnated.

In one embodiment, the metal nanowires may include silver nanowires.

In one embodiment, the matrix may be formed of a matrix composition including a penta- to decafunctional (meth)acrylic compound, a trifunctional (meth)acrylic compound, an initiator, an adhesion enhancer, and an antioxidant.

Another aspect of the present invention relates to a display device including the transparent conductor according to the present invention.

The present invention provides a transparent conductor that contains metal nanowires and has good pattern visibility, low sheet resistance, and good optical properties in terms of haze and transmittance.

BRIEF DESCRIPTION OF THE DRAWINGS

FIG. 1 is a partially cross-sectional view of a transparent conductor in accordance with one embodiment of the present invention.

FIG. 2 is a partially enlarged view of an upper surface of the transparent conductor in accordance with the embodiment of the present invention.

Embodiments of the present invention will be described in detail with reference to the accompanying drawings to provide thorough understanding of the invention to those skilled in the art. It should be understood that the present invention may be embodied in different ways and is not limited to the following embodiments. In the drawings, portions irrelevant to the description will be omitted for clarity. Like components will be denoted by like reference numerals throughout the specification.

As used herein, spatially relative terms such as "upper" and "lower" are defined with reference to the accompanying drawings. Thus, it will be understood that the term "upper surface" can be used interchangeably with the term "lower surface". It will be understood that when an element such as a layer, film, region or substrate is referred to as being placed "on" another element, it can be directly placed on the other element, or intervening layer(s) may also be present. Conversely, when an element is referred to as being placed "directly on" another element, no intervening layer(s) are present.

As used herein, the term "aspect ratio" refers to a ratio (L/d) of the maximum length L of metal nanowires to an average diameter d of the metal nanowires in a sectional view.

In addition, the term "(meth)acryl" may refer to acryl and/or methacryl.

As used herein, "good pattern visibility" means that recognition of a pattern is difficult when a transparent conductor is observed with the naked eye under sunlight, a fluorescent lamp or a three-wavelength lamp. When a transparent conductor having good pattern visibility is mounted on a display, the pattern of the transparent conductor may be invisible.

Hereinafter, a transparent conductor according to one embodiment of the present invention will be described with reference to FIGS. 1 and 2. FIG. 1 is a partially cross-sectional view of a transparent conductor in accordance with one embodiment of the present invention. FIG. 2 is a partially enlarged view of an upper surface of the transparent conductor in accordance with the embodiment of the present invention.

Referring to FIG. 1, a transparent conductor 100 according to one embodiment of the present invention may include a base layer 110 and a transparent conductive pattern layer 120.

The transparent conductor 100 may have transparency in the visible region. For example, the transparent conductor 100 may have transparency at a wavelength of about 400 nm to about 700 nm. Specifically, the transparent conductor 100 may have a haze of about 1.3% or less in the visible region. For example, the transparent conductor 100 may have a haze of about 0.01% to about 1.3%. Within this range, the transparent conductor can exhibit good transparency.

In one embodiment, the transparent conductor 100 may have a total light transmittance of about 90% to about 100%. Specifically, the transparent conductor 100 may have a total light transmittance of about 90% to about 99%. Within this range, the transparent conductor can exhibit good transparency.

The transparent conductor 100 may have a sheet resistance of about 100Ω/□ or less, as measured using a 4-probe or non-contact sheet resistance meter. For example, the transparent conductor 100 may have a sheet resistance of about 30Ω/□ to about 100Ω/□. Within this range, the transparent conductor can be used as an electrode film for touch panels.

The transparent conductor 100 may have a thickness of about 10 μm to about 250 μm. For example, the transparent conductor 100 may have a thickness of about 20 μm to about 200 μm. Within this thickness range, the transparent conductor can be used as a transparent electrode film including a film for touch panels and may also be used as a transparent electrode film for flexible touch panels.

The base layer 110 may support the transparent conductive pattern layer 120 and may include a transparent resin film. Specifically, the base layer 110 may have a light transmittance of about 80% to about 100% at a wavelength of 550 nm. More specifically, the base layer 110 may have a light transmittance of about 85% to about 99% at a wavelength of 550 nm. Within this range, the transparent conductor may have improved optical properties. Specifically, the resin may include at least one selected from among polycarbonates, cyclic olefin polymers, polyester including polyethylene terephthalate, polyethylene naphthalate, and the like, polyolefin, polysulfone, polyimide, silicone, polystyrene, polyacrylic, and polyvinyl chloride resins, without being limited thereto.

The base layer 110 may have a thickness of about 10 μm to about 250 μm. Specifically, the base layer 110 may have a thickness of about 15 μm to about 200 μm, more specifically about 20 μm to about 100 μm. Within this range, the base layer can be used in the transparent conductor.

In FIG. 1, the base layer 110 of the transparent conductor is shown as having a monolayer structure. However, it should be understood that the transparent conductor according to the present invention may include a base layer having a multilayer structure. In addition, although not shown in FIG. 1, a functional layer may be further stacked on one or both surfaces of the base layer 110. Examples of the functional layer may include a hard coating layer, an anti-corrosion layer, an anti-glare coating layer, an adhesion promoting layer, and an oligomer-release prevention layer, without being limited thereto.

The transparent conductive pattern layer 120 may be directly formed on the base layer 110. Herein, "directly formed on" means that there is no other optical layer, such as an adhesive layer, a bonding layer, and the like, between the base layer 110 and the transparent conductive pattern layer 120.

The transparent conductive pattern layer 120 may include conductive regions 120a and non-conductive regions 120b. A plurality of conductive regions 120a forms a first region and non-conductive regions 120b forms a second region. Next, the first region and the second region will be described in detail with reference to FIG. 2.

Referring to FIG. 2, the transparent conductive pattern layer 120 may include the first region composed of the plurality of conductive regions 120a and the second region composed of non-conductive regions 120b.

The conductive region 120a includes metal nanowires and a matrix in which the metal nanowires are impregnated. The non-conductive region 120b does not include the metal nanowires and consists of a matrix. The non-conductive regions 120b are formed between adjacent conductive regions 120a to form a pattern on the transparent conductive pattern layer 120. The non-conductive region refers to a region in which the metal nanowires are not included by etching.

In the transparent conductive pattern layer 120, the non-conductive regions 120b may have a deviation of greater than about 1 to about 1.25, as calculated by Equation 1 and a minimum linewidth of about 40 μm or less.

$$\text{Deviation of non-conductive regions} = A/B, \quad \text{<Equation 1>}$$

where A and B indicate the maximum value and the minimum value of areas of the non-conductive regions included in a unit area of 1 mm² of the transparent conductive pattern layer, respectively.

For example, the non-conductive regions 120b may have a minimum linewidth of about 40 μm or less. In another example, the non-conductive regions 120b may have a minimum linewidth of about 10 μm to about 40 μm. Within this range, the transparent conductor can have good pattern visibility. For example, the non-conductive regions 120b may have a minimum linewidth of about 0.01 μm, about 0.1 μm, about 0.5 μm, about 1 μm, about 2 μm, about 3 μm, about 4 μm, about 5 μm, about 6 μm, about 7 μm, about 8 μm, about 9 μm, about 10 μm, about 11 μm, about 12 μm, about 13 μm, about 14 μm, about 15 μm, about 16 μm, about 17 μm, about 18 μm, about 19 μm, about 20 μm, about 21 μm, about 22 μm, about 23 μm, about 24 μm, about 25 μm, about 26 μm, about 27 μm, about 28 μm, about 29 μm, about 30 μm, about 31 μm, about 32 μm, about 33 μm, about 34 μm, about 35 μm, about 36 μm, about 37 μm, about 38 μm, about 39 μm, or about 40 μm.

That is, the deviation of the non-conductive regions may be calculated by Equation 1 based on the maximum area A and the minimum area B among the areas of the non-conductive regions in a unit area of 1 mm² of the transparent conductive pattern layer. The deviation and the linewidth of the non-conductive regions may be implemented by adjusting the shape of a linewidth of a pattern upon etching after formation of a transparent conductive layer and before formation of a pattern of the transparent conductive layer on the base layer, as described below.

In particular, when the non-conductive regions 120b satisfy the deviation and the linewidth within the above ranges, the transparent conductor can have good pattern visibility, regardless of sheet resistance, transmittance and haze of the transparent conductor before patterning.

The first region may be composed of the conductive regions 120a, some of which may include a dummy pattern 140. For example, the conductive regions 120a may include a driving pattern 130 and the dummy pattern 140. The second region is composed of the non-conductive regions 120b. The second region is continuously formed and refers to a remaining region of the transparent conductive pattern layer 120 excluding the driving pattern 130 and the dummy pattern 140.

The driving pattern 130 is included in the conductive regions and participates in transmission and reception of signals by sensing touch on a touch panel of a display device. Although not shown in FIG. 2, the driving pattern 130 is connected to a driving element of the display device. The non-conductive regions are formed between adjacent driving patterns 130. The dummy pattern 140 is also included in the conductive regions. However, the dummy pattern 140 does not participate in sensing touch on the touch panel of the display device and is formed to provide the deviation of the non-conductive regions calculated by Equation 1. The shape and location of the dummy pattern 140 are not particularly limited so long as the shape and location of the dummy pattern 140 can provide the deviation of the non-conductive regions calculated by Equation 1 and the linewidth thereof within the above ranges.

The location of the dummy pattern 140 is not particularly limited on the transparent conductive pattern layer 120. Referring to FIG. 2, the non-conductive regions may be formed between the driving pattern 130 and the dummy pattern 140. In addition, the non-conductive regions 120b may be formed between adjacent dummy patterns 140. Further, the transparent conductive pattern layer may include a plurality of units each including the non-conductive regions disposed between the adjacent dummy patterns 140.

Referring again to FIG. 1, the conductive region 120a includes metal nanowires 121 and a matrix 122 in which the metal nanowires 121 are impregnated. Although the metal nanowires 121 are shown as being impregnated in the matrix 122 in FIG. 1, some of the metal nanowires 121 may protrude from the matrix 122 in other embodiments.

The metal nanowires 121 may have an aspect ratio of about 10 to about 5,000. Specifically, the metal nanowires 121 may have an aspect ratio of about 100 to about 2,000. More specifically, the metal nanowires 121 may have an aspect ratio of about 500 to about 1,500. Within this range, the transparent conductor can realize a highly conductive network even with a low density of the metal nanowires while reducing sheet resistance thereof. The metal nanowires 121 may have a particle diameter of greater than about 0 nm to about 100 nm in cross-sectional view. Specifically, the metal nanowires 121 may have a particle diameter of about 10 nm to about 100 nm. More specifically, the metal nanowires 121 may have a particle diameter of about 10 nm to about 30 nm, and a maximum length of about 20 µm or more, specifically about 20 µm to about 50 µm. Within this range, the metal nanowires have a high aspect ratio to improve conductivity of the transparent conductor while reducing sheet resistance thereof. In one embodiment, the metal nanowires 121 may be present in an amount of about 7 wt % or more in the transparent conductive pattern layer 120. Specifically, the metal nanowires 121 may be present in an amount of about 8 wt % to about 30 wt %. Within this range, the metal nanowires 121 form a sufficient number of conductive networks to improve conductivity of the transparent conductor. The metal nanowires 121 may include at least one metal selected from among silver, copper, aluminum, nickel, gold, and a combination thereof. Specifically, the metal nanowires 121 may be formed of silver nanowires or a mixture including the same.

The matrix 122 is formed on the base layer 110 and may be formed of a matrix composition. In one embodiment, the matrix composition may include a penta to deca-functional (meth)acrylic compound, a trifunctional (meth)acrylic compound, and an initiator. The penta to deca-functional (meth)acrylic compound may include at least one of a penta to deca-functional (meth)acrylic monomer and a penta to deca-functional (meth)acrylic oligomer. In one embodiment, the penta to deca-functional (meth)acrylic monomer may include a penta to deca-functional (meth)acrylic monomer of $C_3$ to $C_{20}$ polyhydric alcohols. Specifically, the penta to deca-functional (meth)acrylic monomer may include at least one of dipentaerythritol penta(meth)acrylate, dipentaerythritol hexa(meth)acrylate, caprolactone-modified dipentaerythritol penta(meth)acrylate, and caprolactone modified dipentaerythritol hexa(meth)acrylate.

The trifunctional (meth)acrylic monomer may include at least one of a non-modified (meth)acrylic monomer of $C_3$ to $C_{20}$ polyhydric alcohols and a (meth)acrylic monomer of $C_3$ to $C_{20}$ polyhydric alcohols modified with an alkoxy group. These may be used alone or as a mixture thereof. The non-modified (meth)acrylic monomer of $C_3$ to $C_{20}$ polyhydric alcohols may include at least one of trimethylolpropane tri(meth)acrylate, glycerol tri(meth)acrylate, pentaerythritol tri(meth)acrylate, and dipentaerythritol tri(meth)acrylate. The (meth)acrylic monomer of $C_3$ to $C_{20}$ polyhydric alcohols modified with an alkoxy group can further improve light transmittance and reliability of the transparent conductor and is more advantageous in formation of a fine pattern than the non-modified (meth)acrylic monomer of $C_3$ to $C_{20}$ polyhydric alcohols. The alkoxy group may be a $C_1$ to $C_5$ alkoxy group, for example, an ethoxy group, a propoxy group, or a butoxy group. Specifically, the (meth)acrylic monomer of $C_3$ to $C_{20}$ polyhydric alcohols modified with an alkoxy group may include at least one of ethoxylated trimethylolpropane tri(meth)acrylate and propoxylated glyceryl tri(meth)acrylate.

The initiator is a typical photopolymerization initiator and may be at least one of an α-hydroxy ketone initiator and an α-amino ketone initiator. For example, 1-hydroxycyclohexyl phenyl ketone or a mixture including the same may be used as the initiator.

In one embodiment, the matrix composition may include about 60 wt % to about 85 wt % of the penta to deca-functional (meth)acrylic compound in terms of solid content. For example, the penta to deca-functional (meth)acrylic compound may be present in an amount of about 60 wt % to about 80 wt % in the composition. For example, the penta to deca-functional (meth)acrylic compound may be present in an amount of about 60 wt %, about 61 wt %, about 62 wt %, about 63 wt %, about 64 wt %, about 65 wt %, about 66 wt %, about 67 wt %, about 68 wt %, about 69 wt %, about 70 wt %, about 71 wt %, about 72 wt %, about 73 wt %, about 74 wt %, about 75 wt %, about 76 wt %, about 77 wt %, about 78 wt %, about 79 wt %, or about 80 wt %.

In one embodiment, the (meth)acrylic compound may be present in an amount of about 10 wt % to about 30 wt % in the matrix composition in terms of solid content. For example, the (meth)acrylic compound may be present in an amount of about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29, or about 30 wt %.

In one embodiment, the initiator may be present in an amount of about 1 wt % to about 15 wt % in the matrix composition in terms of solid content. For example, the initiator may be present in an amount of about 1 wt %, about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14, or about 15 wt %.

In one embodiment, the matrix composition may further include at least one of an adhesion enhancer, an antioxidant, hollow silica, and a fluorine resin.

In one embodiment, the adhesion enhancer may include at least one of a silane coupling agent and a mono- or bifunctional (meth)acrylic monomer. These may be used alone or as a mixture thereof. The silane coupling agent may include at least one of an epoxy group-containing silane coupling agent, such as 3-glycidoxypropyltrimethoxysilane, 3-glycidoxypropylmethyldimethoxysilane, and 2-(3,4-epoxycyclohexyl)ethyltrimethoxysilane; a polymerizable unsaturated group-containing silane coupling agent, such as vinyltrimethoxysilane, vinyltriethoxysilane, and (meth)acryloxypropyltrimethoxysilane; an amino group-containing silane coupling agent, such as 3-aminopropyltrimethoxysilane, 3-aminopropyltriethoxysilane, N-(2-aminoethyl)-3-aminopropyltrimethoxysilane, and N-(2-aminoethyl)-3-aminopropylmethyldimethoxysilane; and 3-chloropropyltrimethoxysilane.

The mono- or bifunctional (meth)acrylic monomer may include a mono- or bifunctional (meth)acrylic monomer of $C_3$ to $C_{20}$ polyhydric alcohols. Specifically, the mono- or bifunctional (meth)acrylic monomer may include at least one of isobornyl (meth)acrylate, cyclopentyl (meth)acrylate, cyclohexyl (meth)acrylate), trimethylolpropane di(meth)acrylate, ethylene glycol di(meth)acrylate, neopentylglycol di(meth)acrylate, hexanediol di(meth)acrylate, and cyclodecane dimethanol di(meth)acrylate.

In one embodiment, the adhesion enhancer may be present in an amount of about 1 wt % to about 20 wt %, specifically about 5 wt % to about 15 wt %, in the matrix composition in terms of solid content. Within this range, the adhesion enhancer can improve reliability and conductivity of the transparent conductor while enhancing adhesion of the transparent conductive pattern layer. For example, the adhesion enhancer may be present in an amount of about 1 wt %, about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19, or about 20 wt %.

The antioxidant may include at least one of triazole antioxidants, triazine antioxidants, phosphorus antioxidants such as phosphite antioxidants, hindered amine light stabilizer (HALS) antioxidants, phenol antioxidants, and metal acetylacetonate antioxidants.

In one embodiment, the antioxidant may be present in an amount of about 0.01 wt % to about 10 wt % in the matrix composition in terms of solid content. Within this range, the antioxidant can prevent oxidation of the metal nanowires, can secure uniformity of the patterned transparent conductor, and is advantageous in formation of a fine pattern. Specifically, the antioxidant may be present in an amount of about 0.5 wt % to about 5 wt %. For example, the antioxidant may be present in an amount of about 0.01 wt %, about 0.05 wt %, about 0.1 wt %, about 0.5 wt %, about 1 wt %, about 2 wt %, about 3 wt %, about 4 wt %, about 5 wt %, about 6 wt %, about 7 wt %, about 8 wt %, about 9 wt %, or about 10 wt %.

The hollow silica and the fluorine resin can improve visibility by reducing refractivity of the transparent conductive pattern layer.

The transparent conductive pattern layer 120 may have a thickness of about 10 nm to about 1 µm, specifically about 10 nm to about 200 nm. Specifically, the transparent conductive pattern layer 120 may have a thickness of about 20 nm to about 150 nm. Within this range, the transparent conductor can be used as a film for a touch panel and can exhibit reduced contact resistance and improved etchability and optical properties.

Next, a method of manufacturing a transparent conductor according to one embodiment of the present invention will be described.

The method of manufacturing a transparent conductor according to one embodiment may include patterning a transparent conductive layer formed on a base layer by etching the transparent conductive layer to have a pattern in which the non-conductive regions have a predetermined linewidth and a predetermined deviation, as calculated by Equation 1.

Forming the transparent conductive layer on the base layer may be realized by a typical method known to those skilled in the art. Patterning may be performed by etching the transparent conductive layer to have a predetermined pattern in which the non-conductive regions have a predetermined linewidth and a predetermined deviation, as calculated by Equation 1. Etching may be performed by a typical etching method, such as wet etching and the like. The predetermined pattern is designed by a typical method known to those skilled in the art. Patterning may be performed by laser patterning the transparent conductive layer to have a predetermined pattern, instead of etching.

An optical display according to one embodiment of the present invention may include the transparent conductor according to the embodiments of the present invention.

Next, the present invention will be described in more detail with reference to some examples. However, it should be noted that these examples are provided for illustration only and are not to be construed in any way as limiting the present invention.

EXAMPLE 1

37 parts by weight of a metal nanowire-containing solution (ClearOhm ink, Cambrios Technologies Corp., total amount of metal nanowires and binder: 2.45 wt %) was mixed with 63 parts by weight of ultra-pure water to prepare a metal nanowire dispersion.

1.5 parts by weight of 100 parts by weight of a mixture comprising 63 parts by weight of dipentaerythritol hexaacrylate, 21 parts by weight of propoxylated glyceryl triacrylate, 8 parts by weight of an adhesion enhancer (2-(3,4-epoxycyclohexyl)ethyltrimethoxysilane, KBM-303), 4 parts by weight of a mixture of a phenol antioxidant (Irganox 1010) and a phosphorus antioxidant (Irgafos 168), and 4 parts by weight of an initiator (Irgacure 184) was added to 98.5 parts by weight of methyl isobutyl ketone, thereby preparing a matrix composition having a viscosity of 0.56 cP at 25° C.

The metal nanowire dispersion was deposited on a base layer (polycarbonate film, Teijin, thickness: 50 μm) by a spin coater and dried in an oven at 140° C. for 90 seconds. Then, the matrix composition was coated thereon by a spin coater, and dried in an oven at 80° C. for 90 seconds and in an oven at 100° C. for 90 seconds, followed by UV curing at 200 mJ/cm², thereby forming a 90 nm thick transparent conductive layer. The prepared base layer and the prepared transparent conductor stack had a sheet resistance of 50.20Ω/□, a haze of 0.85%, and a light transmittance of 91.80%. Sheet resistance was measured using a non-contact type sheet resistance meter (EC-80P, Napson Co., Ltd.). Haze was measure using a haze meter (NDH-2000, Nippon Denshoku Co., Ltd.) at a wavelength of 400 nm to 700 nm, with the transparent conductive layer disposed to face a light source. Light transmittance was measured using a spectrophotometer (CM3600d, Konica Minolta Co., Ltd.) at a wavelength of 400 nm to 700 nm, with the transparent conductive layer disposed to face a light source.

A photoresist film (SS-03A9, Dongwoo Fine-Chem Inc.) was deposited on the transparent conductive layer by spin coating, dried in an oven at 120° C. for 3 minutes, and exposed to UV light at 200 mJ/cm² through a pattern mask. The pattern mask was designed to form non-conductive regions (etched portion) having a minimum linewidth of 30 μm, including a dummy pattern, and a deviation of 1.25, as calculated by Equation 1.

The sample prepared through exposure to UV light was developed in an aqueous solution containing 5% trimethylammonium hydroxide for 10 seconds, washed with water, and baked in an oven at 120° C. for 3 minutes, thereby forming a patterned layer. The transparent conductor having the patterned layer was dipped in an etchant (Al etchant, mixed solution of 75 wt % to 85 wt % of an aqueous solution containing 85 wt % phosphoric acid, 3 wt % to 10 wt % of an aqueous solution containing 70 wt % nitric acid, and 5 wt % to 20 wt % of an aqueous solution containing 99.7 wt % acetic acid) at 40° C. for etching, thereby preparing a transparent conductor including a transparent conductive pattern layer.

EXAMPLE 2

A base layer and a transparent conductor stack were prepared by the same method as in Example 1 except for RPM of the spin coater upon formation of a transparent conductive layer. The prepared base layer and the prepared transparent conductor stack had a sheet resistance of 30.85Ω/□, a haze of 1.20%, and a light transmittance of 91.20%. A transparent conductor was manufactured by etching in the same manner as in Example 1.

EXAMPLE 3

A transparent conductor was manufactured in the same manner as in Example 2 except that the pattern mask was designed to form non-conductive regions having a minimum linewidth of 35 μm, including a dummy pattern, and a deviation of 1.25 as calculated by Equation 1.

EXAMPLE 4

A transparent conductor was manufactured in the same manner as in Example 2 except that the pattern mask was designed to form non-conductive regions having a minimum linewidth of 40 μm, including a dummy pattern, and a deviation of 1.25 as calculated by Equation 1.

COMPARATIVE EXAMPLE 1

A transparent conductor was manufactured in the same manner as in Example 2 except that the pattern mask was designed to form non-conductive regions having a minimum linewidth of 50 μm, including a dummy pattern, and a deviation of 1.25 as calculated by Equation 1.

COMPARATIVE EXAMPLE 2

A transparent conductor was manufactured in the same manner as in Example 2 except that the pattern mask was designed to form non-conductive regions having a minimum linewidth of 30 μm, including no dummy pattern, and a deviation of 5.00 as calculated by Equation 1.

COMPARATIVE EXAMPLE 3

A transparent conductor was manufactured in the same manner as in Example 2 except that the pattern mask was designed to form non-conductive regions having a minimum linewidth of 30 μm, including a dummy pattern, and a deviation of 2.50 as calculated by Equation 1.

COMPARATIVE EXAMPLE 4

A transparent conductor was manufactured in the same manner as in Example 2 except that the pattern mask was designed to form non-conductive regions having a minimum linewidth of 30 μm, including a dummy pattern, and a deviation of 1.67 as calculated by Equation 1.

Pattern visibility was evaluated on the transparent conductors prepared in Examples and Comparative Examples. In evaluation of pattern visibility, the transparent conductive pattern layer of each transparent conductor was observed with the naked eye under a fluorescent lamp. When the pattern was clearly observed, pattern visibility of the transparent conductor was evaluated as x; when some pattern was observed, pattern visibility of the transparent conductor was evaluated as Δ; and when the pattern was not substantially observed, pattern visibility of the transparent conductor was evaluated as ○. Results are shown in Table 1.

TABLE 1

| Kind | Example1 | Example2 | Example3 | Example4 | Comp. Example 1 | Comp. Example2 | Comp. Example3 | Comp. Example 4 |
|---|---|---|---|---|---|---|---|---|
| Sheet resistance (Ω/□) | 50.20 | 30.85 | 30.85 | 30.85 | 30.85 | 30.85 | 30.85 | 30.85 |
| Haze (%) | 0.85 | 1.20 | 1.20 | 1.20 | 1.20 | 1.20 | 1.20 | 1.20 |
| Light transmittance (%) | 91.80 | 91.20 | 91.20 | 91.20 | 91.20 | 91.20 | 91.20 | 91.20 |
| Minimum linewidth of non-conductive regions (μm) | 30 | 30 | 35 | 40 | 50 | 30 | 30 | 30 |

TABLE 1-continued

| Kind | Example1 | Example2 | Example3 | Example4 | Comp. Example 1 | Comp. Example2 | Comp. Example3 | Comp. Example 4 |
|---|---|---|---|---|---|---|---|---|
| Dummy pattern | Present | Present | Present | Present | Present | Absent | Present | Present |
| Deviation of non-conductive regions by Equation 1 | 1.25 | 1.25 | 1.25 | 1.25 | 1.25 | 5.00 | 2.50 | 1.67 |
| Pattern visibility | ○ | ○ | ○ | ○ | Δ | x | x | x |

As shown in Table 1, the transparent conductors of Examples could improve pattern visibility while maintaining electrical properties including sheet resistance and optical properties including haze and light transmittance within predetermined ranges. Conversely, the transparent conductors of Comparative Examples, in which the deviation of the non-conductive regions calculated by Equation 1 and the minimum linewidth thereof were out of the ranges according to the present invention, exhibited poor pattern visibility.

It should be understood that various modifications, changes, alterations, and equivalent embodiments can be made by those skilled in the art without departing from the spirit and scope of the invention.

The invention claimed is:

1. A transparent conductor comprising: a base layer; and a transparent conductive pattern layer formed on the base layer,
    wherein the transparent conductive pattern layer comprises a plurality of conductive regions and a plurality of non-conductive regions, the plurality of conductive regions comprising a driving pattern and horizontal dummy patterns, the driving pattern defined by horizontal conductive patterns extending from a vertical conductive pattern, and the plurality of non-conductive regions comprising non-conductive regions being disposed between and separating adjacent dummy patterns of the dummy patterns along a first direction of the transparent conductive pattern layer and a second direction of the transparent conductive pattern layer crossing the first direction,
    the plurality of non-conductive regions further comprising non-conductive regions formed between the driving pattern and the dummy patterns, and non-conductive regions formed between adjacent horizontal conductive patterns of the horizontal conductive patterns,
    the plurality of non-conductive regions having a deviation of greater than about 1 to about 1.25, as calculated by the following Equation 1, and a minimum linewidth of about 40 µm or less:

Deviation of non-conductive regions=$A/B$,  <Equation 1> where A and B indicate the maximum value and the minimum value of areas of the plurality of non-conductive regions included in a unit area of 1 $mm^2$ of the transparent conductive pattern layer, respectively.

2. The transparent conductor according to claim 1, wherein the plurality of non-conductive regions have a minimum linewidth of about 10 µm to about 40 µm.

3. The transparent conductor according to claim 1, wherein the plurality of non-conductive regions extend continuously between the plurality of conductive regions.

4. The transparent conductor according to claim 1, wherein the plurality of conductive regions comprise metal nanowires and a matrix in which the metal nanowires are impregnated.

5. The transparent conductor according to claim 4, wherein the metal nanowires comprise silver nanowires.

6. The transparent conductor according to claim 4, wherein the matrix is formed of a matrix composition comprising a penta- to decafunctional (meth)acrylic compound, a trifunctional (meth)acrylic compound, an initiator, an adhesion enhancer, and an antioxidant.

7. A display device comprising the transparent conductor according to claim 1.

* * * * *